United States Patent [19]
Masuda et al.

[11] Patent Number: 5,895,969
[45] Date of Patent: Apr. 20, 1999

[54] THIN TYPE SEMICONDUCTOR DEVICE, MODULE STRUCTURE USING THE DEVICE AND METHOD OF MOUNTING THE DEVICE ON BOARD

[75] Inventors: Masachika Masuda, Tokorozawa; Tamaki Wada, Higashimurayama, both of Japan

[73] Assignee: Hitachi, Ltd. and Hitachi VLSI Engineering Corp., Tokyo, Japan

[*] Notice: This patent is subject to a terminal disclaimer.

[21] Appl. No.: 08/960,332

[22] Filed: Oct. 29, 1997

Related U.S. Application Data

[60] Continuation of application No. 08/487,216, Jun. 7, 1995, Pat. No. 5,723,903, which is a division of application No. 08/065,788, May 24, 1993, Pat. No. 5,446,313.

[30] Foreign Application Priority Data

May 25, 1992 [JP] Japan .................................. 4-132287

[51] Int. Cl.⁶ .................................................. H01L 23/48
[52] U.S. Cl. ......................................... 257/696; 257/676
[58] Field of Search ................................. 257/666, 676, 257/686, 696, 702, 787

[56] References Cited

U.S. PATENT DOCUMENTS

| | | |
|---|---|---|
| 4,649,415 | 3/1987 | Hebert . |
| 4,698,660 | 10/1987 | Kubota et al. . |
| 4,943,843 | 7/1990 | Okinaga et al. . |
| 4,996,587 | 2/1991 | Hinrichsmeyer et al. . |
| 5,018,003 | 5/1991 | Yasunaga et al. . |

(List continued on next page.)

FOREIGN PATENT DOCUMENTS

| | | |
|---|---|---|
| 57-107060 | 7/1982 | Japan . |
| A63-175457 | 7/1988 | Japan . |
| 1-286342 | 11/1989 | Japan . |
| 3-261153 | 11/1991 | Japan . |
| 4-23460 | 1/1992 | Japan . |
| 4-106941 | 4/1992 | Japan . |
| 4-129261 | 4/1992 | Japan . |
| A4-56336 | 5/1992 | Japan . |
| 4-162762 | 6/1992 | Japan . |
| 4-343257 | 11/1992 | Japan . |
| 4-23460 | 1/1993 | Japan . |
| 5-144996 | 6/1993 | Japan . |
| 5-175406 | 7/1993 | Japan . |
| 5-315520 | 11/1993 | Japan . |

OTHER PUBLICATIONS

"DRAM TSOP", in Gain 83, Hitachi, Ltd., Nov. 1990, pp. 30–31 (Translation or concise explanation of relevant portions on currently available).

Article Relating to TSOPs/TABs), in Nikkei Microdevices, Feb., 1991, pp. 65–66 (Translation or concise explanation of relevant portions not currently available.

*Primary Examiner*—Olik Chaudhuri
*Assistant Examiner*—Nathan Kelley
*Attorney, Agent, or Firm*—Pennie & Edmonds, LLP

[57] ABSTRACT

Ends of inner leads are disposed in the vicinity of a peripheral end of a semiconductor chip and a portion of an insulating film tape is affixed to a main surface of the semiconductor chip by an adhesive while other portions of the insulating film tape are affixed to portions of the inner leads by an adhesive. Electrode pads provided in the main surface of the semiconductor chip are electrically connected to the ends of the corresponding inner leads by bonding wires, and the semiconductor chip, the inner leads, the electrode pads, the insulating film tape and the bonding wires are sealed by a resin molding. The thickness of the insulating film tape is smaller than a height from the main surface of the semiconductor chip to an apex of the bonding wire. Surfaces of the ends of the inner leads connected to the bonding wires are positioned lower than the main surface of the semiconductor chip and the inner leads are positioned between the main surface and an opposite surface of the semiconductor chip.

36 Claims, 6 Drawing Sheets

U.S. PATENT DOCUMENTS

| | | |
|---|---|---|
| 5,055,912 | 10/1991 | Murasawa et al. |
| 5,072,280 | 12/1991 | Matsukura |
| 5,184,208 | 2/1993 | Sakuta et al. |
| 5,245,215 | 9/1993 | Sawaya |
| 5,252,853 | 10/1993 | Michii |
| 5,394,010 | 2/1995 | Tazawa et al. |
| 5,446,313 | 8/1995 | Masuda et al. .......................... 257/702 |
| 5,723,903 | 3/1998 | Masuda et al. .......................... 257/696 |

THIN TYPE SEMICONDUCTOR DEVICE, MODULE STRUCTURE USING THE DEVICE AND METHOD OF MOUNTING THE DEVICE ON BOARD

This is a continuation of application Ser. No. 08/487,216 filed on Jun. 7, 1995, which is a divisional of application Ser. No. 08/065,788, filed May 24, 1993, now U.S. Pat. Nos. 5,723,903 and 5,446,313, respectively.

BACKGROUND OF THE INVENTION

1. Field of the Invention

The present invention relates to a thin type semiconductor device, a module structure using the semiconductor device and a method of mounting the semiconductor device on a board, and more particularly to a very thin type semiconductor device applicable to a memory card, a large capacity memory device mounted in a small package in which semiconductor devices are stacked in multi-layer or the like, a module structure using it, and a method of mounting it on a board.

2. Description of the Related Art

As a small package of a conventional thin type semiconductor device, a TSOP (Thin Small Outline Package) adopting a lead frame with tabs and a wire bonding method and having a thickness of 1.2 mm has been developed. This TSOP is described in, for example, GAIN 83 issued by Hitachi, Ltd.

A large-capacity memory card having a thickness of 3.3 mm and thin type semiconductor devices of the TSOP type mounted on both sides of a board to maximize a mounting efficiency has been developed. However, since there is a strong demand for a thinner TSOP, there has been proposed a TCP (Tape Carrier Package) having a thickness of 0.5 mm and the same external shape in size as that of the TSOP. The TCP is described in, for example, NIKKEI MICRODEVICE, February 1991, pp. 65–66. A thin type semiconductor device of the TCP type includes semiconductor chips which are thinned by about 0.2 mm and are electrically connected to inner leads by means of the TAB (Tape Automated Bonding) and is configured into a plastic molded structure.

Disclosed in JP-A-4-106941 is a semiconductor device having a package, the thickness of which is thinned by adhering a thin element-holding member of heat-resistant resin molded of polyimide to part of a diffused surface of a semiconductor element and part of inner leads. In this device, when electrodes of the semiconductor element is connected to the inner leads by metal wire, space between an end of the semiconductor element and the metal wire is made large so that the end and the metal wire are not short-circuited to each other, and a main surface of the semiconductor element and an upper surface of the inner leads are made coplanar.

Further, a semiconductor device having semiconductor elements each having a main surface which is supported by a lower surface of part of an insulating tape on which metal film leads are disposed is disclosed in JP-A-3-261153.

In addition, there is disclosed a semiconductor device having semiconductor elements each having a main surface on which a tab (die pad) for a lead frame is disposed and being supported by the tab.

SUMMARY OF THE INVENTION

The inventor has found the following problems as a result of studying a thin type semiconductor device having a plastic molded TCP structure using the TAB bonding.

(1) Outer leads are made of copper leaf and accordingly the strength thereof is weak. Thus, the leads tend to bend which leads to contact failure.

(2) Since the strength of the outer leads is weak, it is difficult to select a socket.

(3) The TAB bonding method is used and hence the semiconductor device is expensive as compared with the bonding using the lead frame.

In the JP-A-4-106941 described above, since the main surface of the semiconductor element and the upper surface of the inner leads are made coplanar, the height of an apex of the metal wire from the main surface of the semiconductor element is high when the electrodes of the semiconductor element are connected to the inner leads by means of the metal wire. Thus, a thin type package cannot be obtained. Further, even if the connection by the metal wire is made by the wire reverse bonding, the package cannot be thinned sufficiently since the main surface of the semiconductor element and the upper surface of the inner leads are coplanar.

Furthermore, in the JP-A-3-261153, since the upper surface of the inner leads is positioned higher than the main surface of the semiconductor element, the height of an apex of bonding wire from the main surface of the semiconductor element (hereinafter referred to as a loop height) has to be high, not obtaining a thin type package.

Moreover, in the JP-A-1-286342, the die pad which is thicker than a resin tape is positioned on the main surface of the semiconductor element and the upper surface of the inner leads is positioned higher than the main surface of the semiconductor element. Accordingly, the loop height has to be high, not obtaining a thin type package.

It is an object of the present invention to provide a thin type semiconductor device of a TOC (Tape On Chip) package or the like having a thickness of about 0.5 mm, a module structure using it and a method of mounting it on a board.

It is another object of the present invention to provide a thin type semiconductor device having a thickness of about 0.5 mm and using a lead frame with outer leads having increased strength, a module structure using it and a method of mounting it on a board.

According to an aspect of the present invention, there is provided a thin type semiconductor device which includes inner leads having ends disposed in the vicinity of a peripheral end of a semiconductor chip. A portion of an insulating film tape is affixed to a main surface of the semiconductor chip by an adhesive and other portions affixed to portions thereof of the inner leads by an adhesive. Bonding wires for electrically connecting electrode pads are disposed on the main surface of the semiconductor chip to the ends of the inner leads corresponding to the electrode pads. The semiconductor chip, the inner leads, the electrode pads, the insulating film tape and the bonding are sealed with a resin molding. The thickness of the insulating film tape is made smaller than the height or distance from the main surface to an apex of the bonding wires. The surfaces of the ends of the inner leads connected to the bonding wires are positioned lower than the main surface of the semiconductor chip, with the inner leads being positioned between the main surface and the opposite surface of the semiconductor chip.

In this manner, the thickness of the insulating film tape for supporting the chip is smaller than the height from the main surface of the semiconductor chip to the apex of the bonding wire. The surfaces of the ends of the inner leads connected to the bonding wire are positioned lower than the main surface of the semiconductor chip and the inner leads are positioned between the main surface and the opposite surface of the semiconductor chip. Accordingly, a thin type semiconductor device of the TOC (Tape On Chip) package or the like having a thickness of about 0.5 mm and outer leads having increased strength can be obtained.

According to an example of the present invention, since a ball of bonding wire used in the ball bonding method is disposed on the inner lead and an end of wire opposite to the ball is disposed on the semiconductor chip so that a thick resin molding can be provided on the bonding wire, a very thin type semiconductor device having a thinner thickness can be obtained.

According to an example of the present invention, the portions of the inner leads to which the insulating film tape is affixed are positioned in the same plane as the main surface of the semiconductor chip. Accordingly, the insulating film tape can easily be affixed to the inner leads.

According to an example of the present invention, each of the inner leads extends outwardly from a substantially center portion in the width in the vertical direction to the main surface of the resin molding to form an outer lead. Accordingly, the resin molding can be made thinner.

According to an example of the present invention, the width of each of the outer leads in the vertical direction to the main surface is larger than the width of the resin molding in the vertical direction to the main surface. Accordingly, since a portion of each of the outer leads is projected from the resin molding, the outer leads can be soldered satisfactorily even if a board is warped upon soldering.

According to an example of the present invention, each of the outer leads includes a first portion extending substantially parallel with the main surface from the resin molding, a second portion bent toward one of opposite surfaces of the resin molding substantially parallel with the main surface from the first portion, a third portion extending outwardly from the second portion to substantially the same level as one of the opposite surfaces, a fourth portion bent toward the other of the opposite surfaces from the third portion, and a fifth portion extending inwardly from the fourth portion to be the substantially same level as the other of the opposite surfaces. In this manner, since the outer leads are bent to increase the length of the outer leads and to exhibit the resilience so that the stress by a temperature cycle upon soldering can be absorbed, occurrence of crack in solder of a mounting portion can be prevented.

According to an example of the present invention, each of the outer leads includes a plated layer in its outer periphery. Accordingly, soldering can be made collectively and specifically, since a plurality of stacked semiconductor devices can be soldered at the same time, fabrication processes can be greatly reduced.

According to another aspect of the present invention, there is provided a thin type semiconductor device which includes inner leads having ends disposed in the vicinity of a peripheral end of a semiconductor chip, a portion of an insulating film tape is affixed to a main surface of the semiconductor chip by an adhesive and other portions affixed to portions thereof of the inner leads by an adhesive. Bonding wires for electrically connecting electrode pads are disposed on the main surface of the semiconductor chip to the ends of the inner leads corresponding to the electrode pads. The semiconductor chip, the inner leads, the electrode pads, the insulating film tape and the bonding wires are sealed with a resin molding. The thickness of the insulating film tape is smaller than the height from the main surface to an apex of the bonding wires. Each of the inner leads extends outwardly from the resin molding to form outer leads, each of which includes a first portion extending substantially parallel with the main surface from the resin molding, a second portion bent toward one of opposite surfaces of the resin molding substantially parallel with the main surface from the first portion, a third portion extending outwardly from the second portion to substantially the same level as one of the opposite surfaces, a fourth portion bent toward the other of the opposite surfaces from the third portion, and a fifth portion extending inwardly from the fourth portion to be the substantially same level as the other of the opposite surfaces.

DESCRIPTION OF THE PREFERRED EMBODIMENTS

Embodiments of the present invention are now described with reference to the accompanying drawings.

Elements or portions having the same function are designated by the same reference numerals throughout the figures for explaining the embodiments and description thereof is not repeated.

Figure 1:
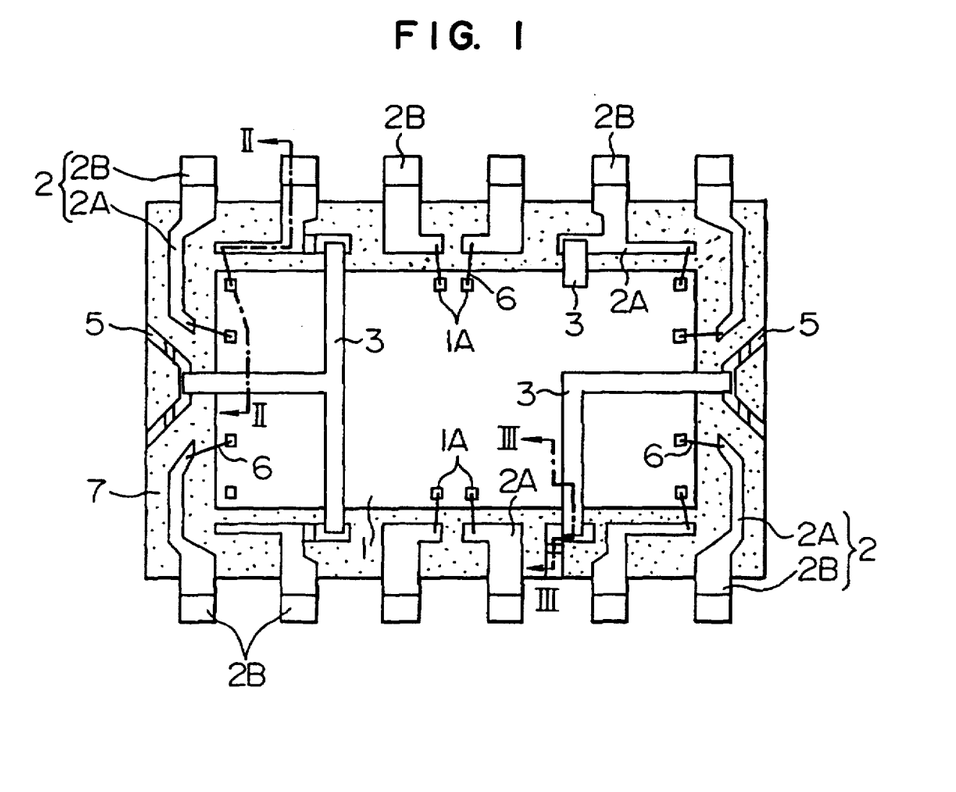
FIG. 1 is a plan view showing a thin type semiconductor device of a TOC package according to a first embodiment of the present invention with an upper half of resin molding being removed.
Figure 2:
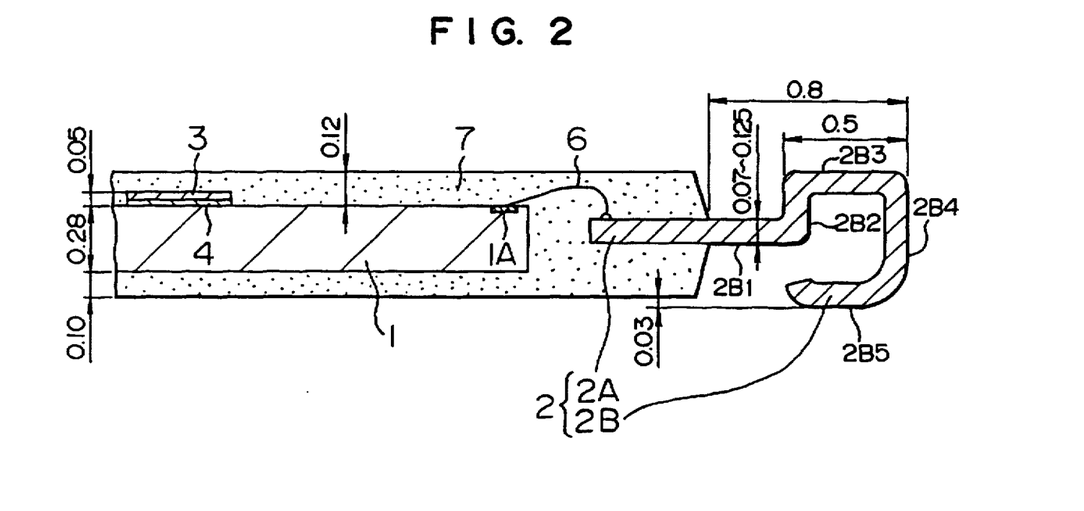
FIG. 2 is a sectional view taken along line II—II of FIG. 1.
Figure 3:
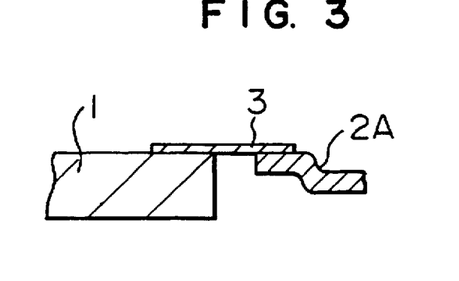
FIG. 3 is a sectional view taken along line III—III of FIG. 1.

FIG. 1 is a plan view of a thin type semiconductor device of a TOC (Tape On Chip) package according to a first embodiment of the present invention in which the upper half of the resin molding is removed to reveal the configuration of the device. FIGS. 2 and 3 are sectional views taken along line II—II and III—III of FIG. 1, respectively.

The thin type semiconductor device (TOC package) of the first embodiment includes, as shown in FIGS. 1 and 2, a semiconductor chip 1 and leads 2 having inner leads 2A of which ends are disposed flatwise in the vicinity of the peripheral edge of the semiconductor chip 1. A portion of an insulating film tape 3 in the form of strip is affixed to a main surface of the semiconductor chip 1 by an adhesive 4 and other portions of the insulating film tape 3 are affixed by the adhesive 4 to some of the inner leads 2A or on at least one, for example, of support leads 5 when the support leads are provided. Electrode pads 1A provided in the main surface of the semiconductor chip 1 are electrically connected to ends of the corresponding inner leads 2A by bonding wires 6, and the electrode pads, the inner leads and the bonding wires are sealed by the resin molding 7.

Figure 4:
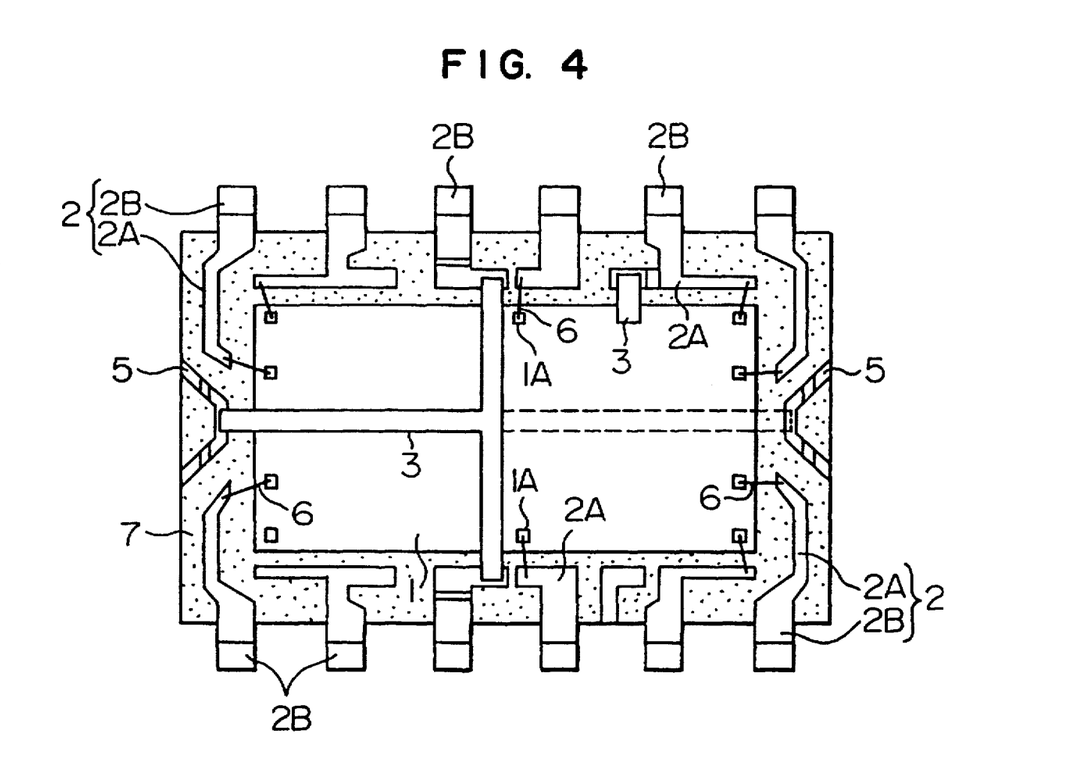
FIG. 4 is a plan view showing a thin type semiconductor device of FIG. 1 with the exception that a support structure by insulating tape is different from that of FIG. 1.

The insulating film tape 3 for supporting the semiconductor chip 1 supports the inner leads 2A at preferably 4 points or more, but at least 3 points so that the semiconductor chip 1 is not inclined or moved upon molding. More particularly, when the insulating film tape supports the inner leads at 4 points, a cross-shaped insulating film tape 3, for example, is used to support the inner leads by four ends of the tape as shown by broken line of FIG. 4. When the tape supports the inner leads at 3 points, a T-shaped insulating film tape, for example, is used to support the inner leads by three ends thereof as shown by solid line of FIG. 4. In this case, when at least one support lead 5 is provided, the support leads may be supported by at least one end of the insulating tape.

Polyimide resin, for example, is used as the insulating film tape 3 and polyimide resin or epoxy resin, for example, is used as the adhesive 4. The thickness of the insulating film tape 3 is smaller than the height or distance from the main surface of the semiconductor chip 1 to an apex of the bonding wire 6 (hereinafter referred to as a loop height) and is equal to, for example, 0.05 mm including the thickness of the adhesive 4 as shown in FIG. 2. The thickness from a lower surface of the resin molding 7 to the semiconductor chip 1 is 0.10 mm. The thickness of the semiconductor chip 1 is 0.28 mm. The thickness from the main surface of the semiconductor chip 1 to an upper surface of the resin molding 7 is 0.12 mm. The height difference between the lowermost surface of the outer leads and the lower surface of the resin molding 7 is 0.03 mm. Accordingly, when mounted to a mounting board, a spacing of 0.03 mm is formed between the lower surface of the molding 7 and the mounting board.

The resin molding 7 uses epoxy resin added with phenol curing agent, silicone rubber and filler in order to attain low stress, for example.

Bonding of the bonding wire 6 uses the ball bonding method in which a ball of the bonding wire 6 is disposed on the inner lead 2A and an end of the bonding wire opposite to the ball is disposed on the semiconductor chip 1. With such reverse bonding, an amount or thickness of resin molding 7 provided on the bonding wire 6 is increased and accordingly if the thickness of the device is the same, the reliability is improved. Further, since the amount of the resin molding 7 on the bonding wire 6 can be reduced if there is no problem in the reliability, the thickness of the device can be reduced. Accordingly, selection of the reverse bonding or the normal bonding may be made depending on a demand for a thickness of the semiconductor device.

Further, as apparent from FIG. 2, a bonding surface of the inner lead is positioned lower than the main surface of the semiconductor chip and a surface of the inner lead opposite the bonding surface is positioned higher than a surface of the semiconductor chip opposite the main surface thereof. Thus, the loop height can be lowered and a length of the bonding wire can be reduced.

End portions of the inner leads to which the insulating film tape 3 is affixed are bent to the same level as the main surface of the semiconductor chip as shown in FIG. 3. Accordingly, the insulating film tape is easily affixed to the end portions of the inner leads.

Further, as shown in FIG. 2, the lead is projected from the substantially center portion of the resin molding or the package in the thickness direction.

The outer lead 2B includes a portion (2B1) which continues from the inner lead and extends laterally from the substantially center portion of the package in the thickness direction substantially parallel with the main surface of the semiconductor chip, a portion (2B2) bent on the side of the main surface from the portion (2B1), a portion (2B3) bent from the portion (2B2) to the same level as the surface of the package on the side of the main surface, a portion (2B4) bent from the portion (2B3) to the opposite side of the main surface of the semiconductor chip substantially perpendicular to the main surface, and a portion (2B5) bent from the portion (2B4) toward the package at substantially the same level as the surface of the package on the opposite side of the main surface. The lower surface of the portion (2B5) is preferably projected about 0.03 mm from the lower surface of the resin molding (package). Consequently, when the semiconductor device is mounted on a board and the leads thereof are soldered on the board, the portion (2B5) can be soldered on the board securely even if the board is warped or distorted.

Figure 9:
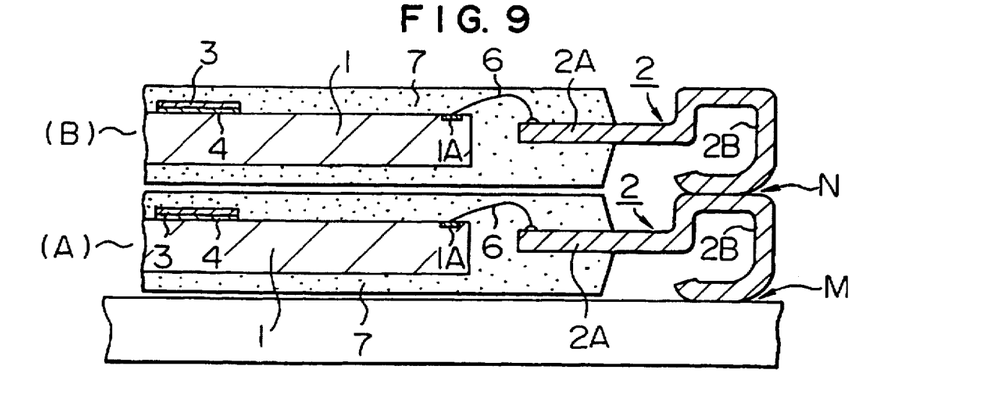
FIG. 9 is a sectional view for explaining a method of mounting two semiconductor devices of the first embodiment on a board so that the one of them is stacked on the other.
Figure 11:
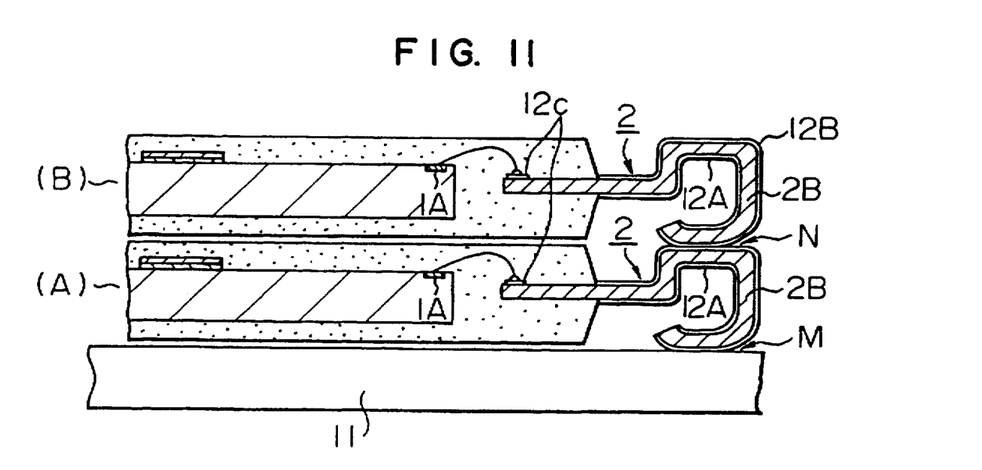
FIG. 11 is a sectional view for explaining another method of mounting the semiconductor devices of the present invention on a board so that one of them is stacked on the other.

Further, as shown in FIGS. 9 and 11, when the semiconductor devices are stacked on the board and soldered, the surface 2B4 of the outer leads 2B is not required to be substantially perpendicular to the main surface of the semiconductor devices and may be inclined from the surface perpendicular to the main surface.

Figure 6:
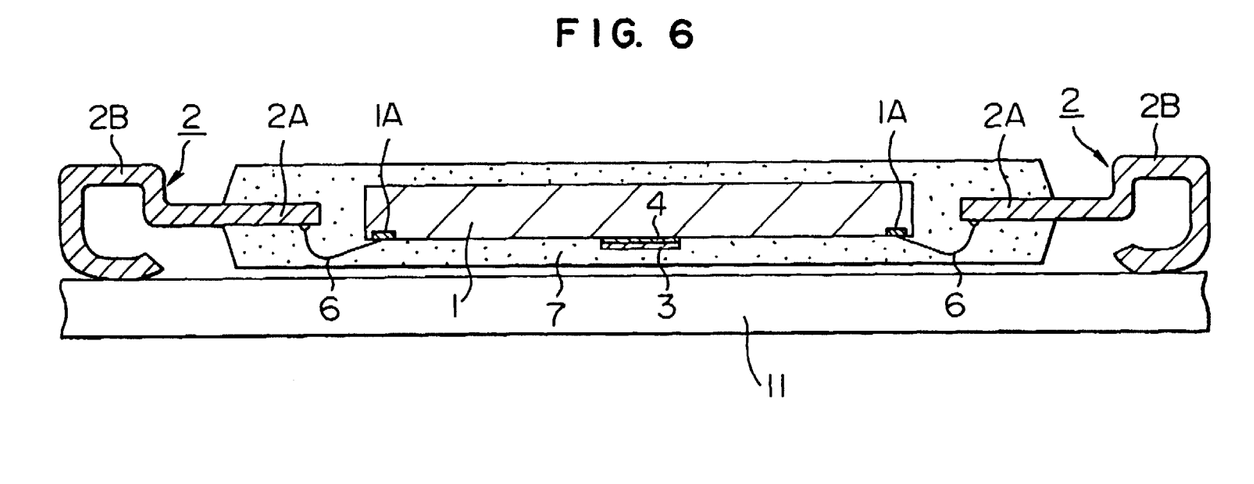
FIG. 6 is a sectional view showing the semiconductor device of the first embodiment including a semiconductor chip which is mounted so that a main surface thereof is opposite to a mounting board to block incidence of light on the main surface of the semiconductor chip.

In contrast to FIG. 2, the outer lead 2B may be formed to be bent on the side of the main surface of the semiconductor chip from the substantially center portion of the package in the thickness direction (refer to FIG. 6). Such an outer lead is named a reversely bent outer lead and the outer lead shown in FIG. 2 is named a normally bent outer lead.

In this manner, since the outer lead 2B is bent in a substantially J-shaped structure, the overall length of the outer lead 2B can be increased, thus providing resilience. With such a structure, since stress by the temperature cycle occurring upon soldering after mounting on the board is absorbed by the resilience of the outer lead 2B, occurrence of crack in a solder of a connection portion between the wiring pad of the mounting board and the outer lead can be prevented.

The inner leads 2A and the outer leads 2B are integrally formed in the lead frame before the cutting process. The lead frame is made of, for example, an alloy of Fe—Ni (containing, for example, 42 or 50% of Ni), Cu or the like.

A fabrication process of the thin type semiconductor device of the embodiment is now described simply.

The fabrication process of the thin type semiconductor device of the embodiment is made in order of the following processes.

(1) The insulating film tape 3 is fixedly affixed to some of the inner leads 2A of the lead frame by a thermoplastic adhesive 4.

(2) The semiconductor chip 1 is fixedly affixed to the insulating film tape 3 by a thermoplastic adhesive 4 (pellet bonding).

(3) The semiconductor chip 1 is fixed by sucking a lower base by vacuum and the wire bonding is made.

(4) The whole semiconductor chip is molded and sealed by a resin.

(5) The outer leads 2B are subjected to the solder-plating process so that a solder-plated layer (not shown) having a thickness of about 10 μm is provided on, for example, the whole of the outer leads.

(6) The outer leads 2B are cut off from the lead frame.

(7) The outer leads 2B are bent in the substantially J-shaped structure as described above. This bending process is composed of five processes.

(8) A mark is put and selection is made.

As apparent from the foregoing description, according to the embodiment, since the lead frame is used as the leads, the strength of the outer leads 2B can be increased. Further, a portion of the insulating film tape 3 is affixed to the main surface of the semiconductor chip 1 and other portions of the insulating film tape 3 are affixed to some of the inner leads 2A or the support leads by the adhesive 4. The electrode pads 1A provided in the main surface of the semiconductor chip 1 are electrically connected to the ends of the inner leads 2A by means of the bonding wires 6 and the whole semiconductor chip is sealed by the resin molding 7. The thickness of the insulating film tape 3 is smaller than the loop height of the bonding wire 6. Accordingly, the thin type semiconductor device of TOC package having a thickness of about 0.5 mm can be obtained.

The wire bonding is made by using the ball bonding method to form the reverse bonding wire structure in which a ball of the bonding wire 6 is provided in the inner lead 2A and an end of the bonding wire opposite to the ball is provided in the semiconductor chip 1. Further, since the bonding surface of the inner leads is positioned to be lower than the main surface of the semiconductor chip, the resin molding provided on the bonding wire 6 can be reduced and accordingly the very thin type semiconductor device having a thinner thickness can be obtained.

Further, the outer lead 2B is bent to form the portion 2B2 so that the overall length of the outer lead 2B is increased and the outer lead has the resilience, so that the stress by the temperature cycle can be absorbed and accordingly occurrence of crack in solder of the mounting portion.

Figure 5:
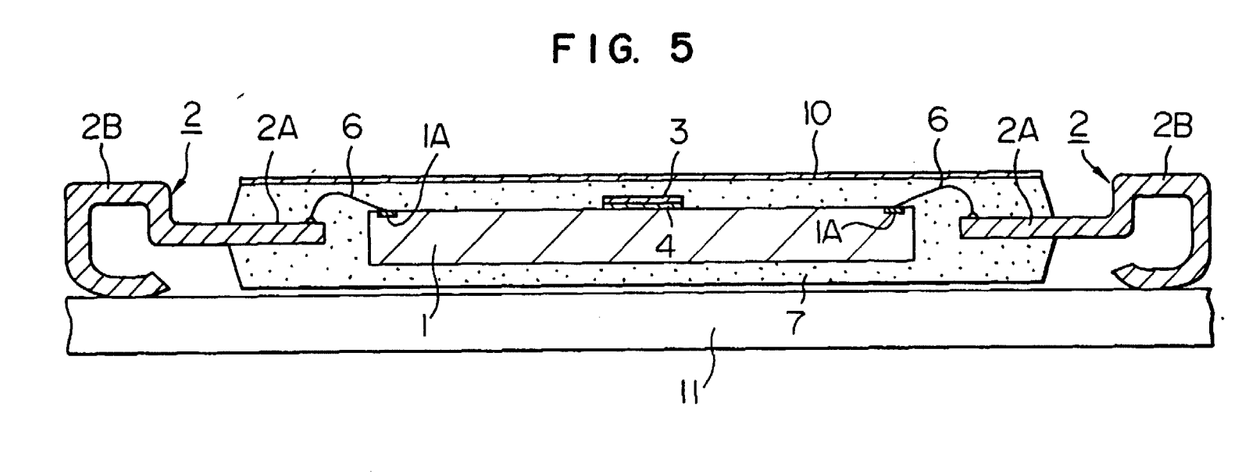
FIG. 5 is a sectional view showing a modification of the first embodiment in which incident light blocking means such as aluminum leaf is disposed on a main surface of a semiconductor chip.

In the embodiment, incident light blocking means such as aluminum leaf 10 is disposed above the main surface of the semiconductor chip 1 as shown in FIG. 5 or the semiconductor chip 1 is mounted so that the main surface of the semiconductor chip 1 is opposite to the mounting board 11 to thereby block incidence of light on the main surface of the semiconductor chip 1. In this manner, since the provision of the incident light blocking means can prevent incidence of light on the main surface of the semiconductor chip 1, the characteristics such as the data retention deterioration from exposure to light are prevented.

Figure 7:
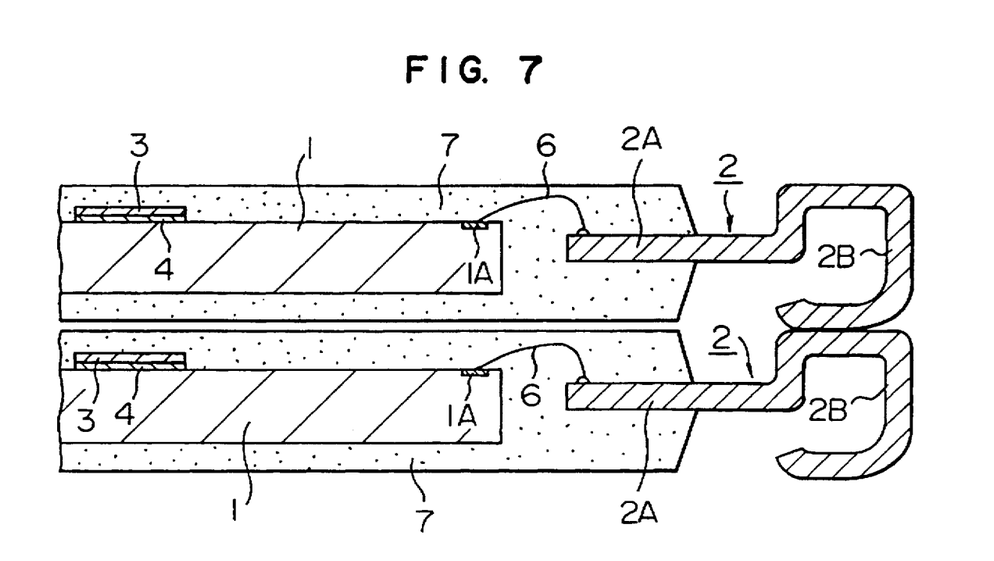
FIG. 7 is a sectional view of a stacked device according to a second embodiment in which two semiconductor devices of the first embodiment are stacked.

FIG. 7 is a partially sectional view illustrating a stacked device of a second embodiment of the present invention.

As shown in FIG. 7, the stacked device of the embodiment includes two thin type semiconductor devices of TOC package of the first embodiment which are stacked on each other.

In the memory device of the embodiment, bonding wires of both of the semiconductor devices are formed in the reverse bonding wire structure in which a ball of the bonding wire 6 is disposed on the inner lead 2A and an end of the bonding wire opposite to the ball is disposed on the semiconductor chip 1. However, the bonding wire 6 of a lower thin type semiconductor device can be formed in the reverse bonding wire structure and the bonding wire 6 of the upper thin type semiconductor device can be formed in the normal bonding wire structure.

As apparent from the foregoing description, according to the embodiment of the present invention, even if the very thin type semiconductor devices are stacked, a large capacity memory device having a thickness of about 1 mm can be obtained.

In the embodiment, the stacked device including the two stacked semiconductor devices has been described, while it can be easily anticipated that the stacked device can include the more semiconductor devices stacked in a multi-layer.

The semiconductor devices shown in FIG. 5 may be stacked in a multi-layer to form a stacked stacked device.

A method of mounting the semiconductor devices and the stacked devices of the embodiments on a board to form a module structure is now described. First of all, referring to FIG. 8, a method of mounting the semiconductor device of the first embodiment, for example, on the board is described.

Figure 8:
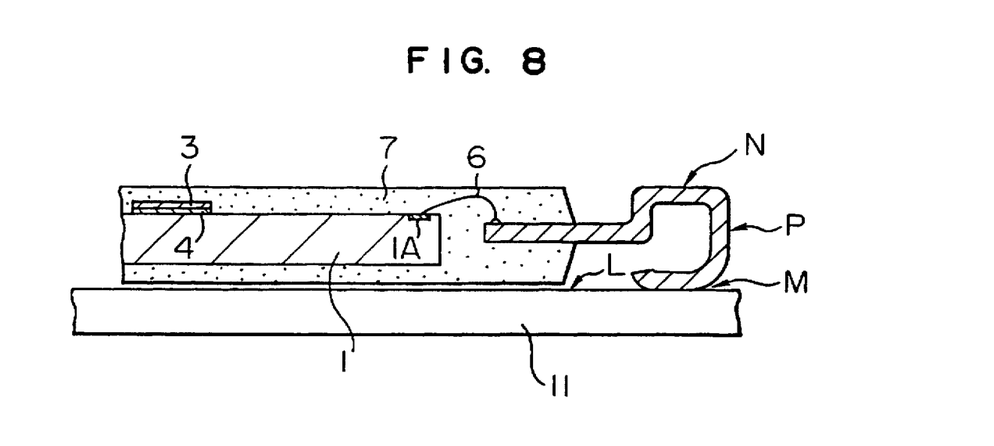
FIG. 8 is a sectional view for explaining a method of mounting the semiconductor device of the first embodiment on a board.

(1) Soldering paste is applied on portions on the surface L of a printed board 11 corresponding to M portions (outer surfaces of 2B5) of the outer leads 2B of the semiconductor device or the semiconductor package.

(2) The semiconductor device is mounted on the printed board and is soldered (for example, reflow soldering).

Referring now to FIG. 9, description is made to the case where the two semiconductor devices are stacked in two layers.

(1) Solder paste is applied on N portions (outer surfaces of 2B3) of the outer leads 2B of the semiconductor device (A) mounted on the board as described above.

(2) Another semiconductor device (B) is mounted on the semiconductor device (A) and soldered. Such processes can be repeated to thereby stack two or more semiconductor devices on the board.

Further, after soldering the N portions of the semiconductor device (A) on which the semiconductor device (B) is mounted, these integrally mounted semiconductor devices may be mounted on the board.

Figure 10:
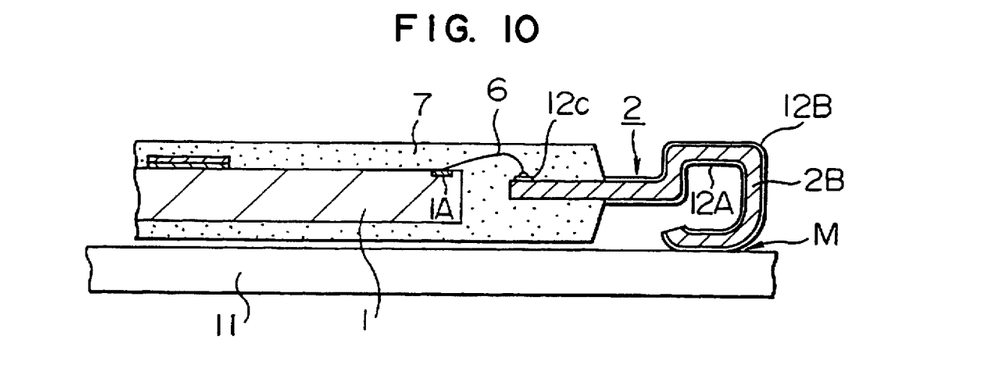
FIG. 10 is a sectional view for explaining another method of mounting a semiconductor device of the present invention on a board.

A method of mounting a semiconductor device including solder-plated layers 12A and 12B having a thickness of, for example, 20 μm and provided on the whole, for example, of the outer leads as shown in FIG. 10 on the board is now described.

In this case, the semiconductor device is mounted as shown in FIG. 10 and the solder-plated layers are heated by a solder-plated layer meltable temperature (for example, 195° C. or more) to thereby melt the plated layer of the M portion so that soldering is made. The thickness of the solder-plated layer is preferably about 20 μm so as to be able to form the outer lead easily.

A method of stacking the semiconductor devices having such solder-plated layers in two layers is now described. In this case, as shown in FIG. 11, the two semiconductor devices are mounted on the board 11 to be stacked in two layers and heated by the temperature to melt the solder-plated layers of the N and M portions so that solder is made. With such a method, the soldering process can be completed at one time regardless of the number of layers of the semiconductor devices. Further, when the semiconductor devices are stacked, preliminary heating may be made by the temperature of about 190° C. to melt the solder-plated layer slightly after the semiconductor devices are mounted on the board, and the semiconductor devices after fixedly mounted on the board may be heated by the temperature of 195° C. or more.

When the semiconductor devices serving as semiconductor memory devices such as a dynamic random access memory (DRAM) are stacked in two layers, two lead pins for the chip selection are increased in each of the semiconductor devices. Accordingly, when the semiconductor devices of the embodiment are stacked in N layers to constitute a memory, N lead pins for the chip selection are increased in each of the semiconductor devices.

The semiconductor device shown in FIGS. 2, 3 and 5 to 9 excluding FIGS. 10 and 11 also includes the outer leads on which a plated layer having a thickness of about 10 μm is provided in the same manner as shown in FIGS. 10 and 11, although not shown.

In the embodiments, the plated layer of the outer leads may be provided only in the portion of the outer leads to which soldering is made or only in the outside of the outer leads (for example, 12B of FIG. 10).

In the embodiments, a silver-plated layer 12C is provided in the portion of the inner leads to which the bonding wire is bonded as shown in FIGS. 10 and 11.

Some embodiments of the module structure having the semiconductor devices of the embodiments mounted on the board is now described.

Figure 12:
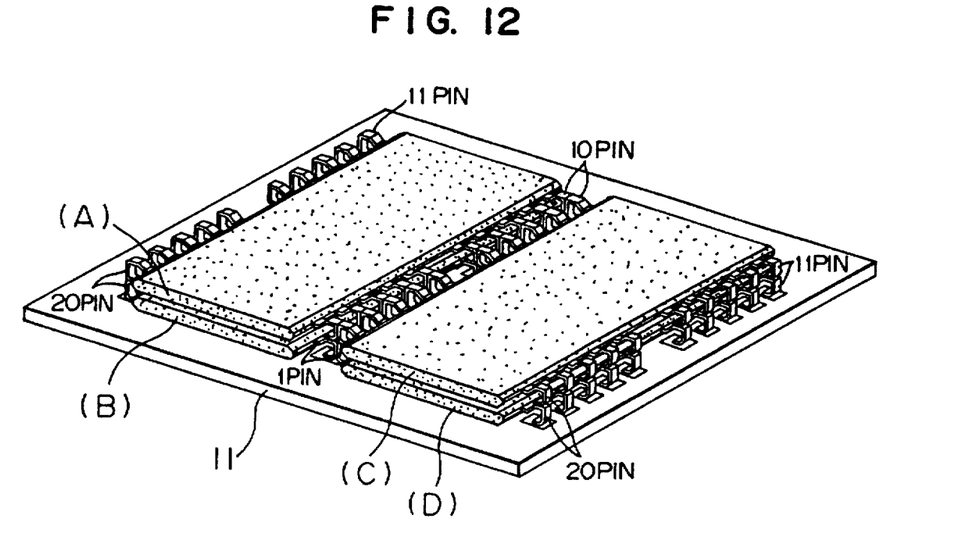
FIG. 12 is a perspective view showing an embodiment of a module structure of the semiconductor devices of the present invention.

FIG. 12 shows an embodiment of a module structure in which a plurality of, for example, two stacked semiconductor devices are put side by side into a plurality of columns, for example, two columns. The semiconductor devices (A) and (B) put in one of two columns include the normally bent outer leads as shown in FIGS. 9 or 11 and the devices (C) and (D) put in the other include the reversely bent outer leads as shown in FIG. 6. In this case, the pin numbers of the outer leads of the semiconductor devices (A) and (B) and those of the corresponding outer leads of the semiconductor devices (C) and (D) are the same as, for example, pin 1 to pin 10. Accordingly, since a wiring length of connecting the pin 1 of the semiconductor devices (A) and (B) to the pin 1 of the semiconductor devices (C) and (D), for example, can be shortened, noise can be reduced and high-speed data processing can be attained. Further, the semiconductor devices can be mounted with high density and accordingly a memory capacity in the same space as in the prior art can be increased.

A method of fabricating such a module structure is now described. Description is made to the case where the semiconductor devices include the normal outer leads as shown in FIGS. 8 and 9.

As one method, in the same manner as the fabricating method of the stacked device of FIG. 9, the semiconductor devices (A) and (B) to be put in one column are soldered to each other and the semiconductor devices (C) and (D) to be put in the other column are then soldered to each other in the same manner. These stacked devices put in two columns are soldered to the board 11 and the surfaces 2B4 of the corresponding outer leads of the semiconductor devices put in two columns are soldered to each other. In this case, soldering paste is applied on the surfaces P of the outer leads shown in FIG. 8 to make soldering.

As a further method, the semiconductor devices (B) and (D) may be soldered to the board and the semiconductor devices (A) and (C) may be then stacked on the semiconductor devices (B) and (D), respectively, to be soldered.

On the other hand, when the outer leads of the semiconductor devices are provided with the solder-plated layers 12A and 12B as shown in FIG. 10, all of the semiconductor devices (A) to (D) are disposed as shown in FIG. 12 and can be then soldered collectively in the same manner as the embodiment of FIG. 11.

In the embodiment of FIG. 12, the two stacked device are put in two columns, while a plurality of one-layered semiconductor devices may be put side by side. In this case, the semiconductor devices having the normally bent outer leads may be alternated with those having the reversely bent outer leads. In addition, the embodiment can be applied to the case where a plurality of semiconductor devices stacked in three or more layers are put side by side. Even in this case, the stacked devices having the normally and reversely bent outer leads may be alternated side by side.

Figure 13:
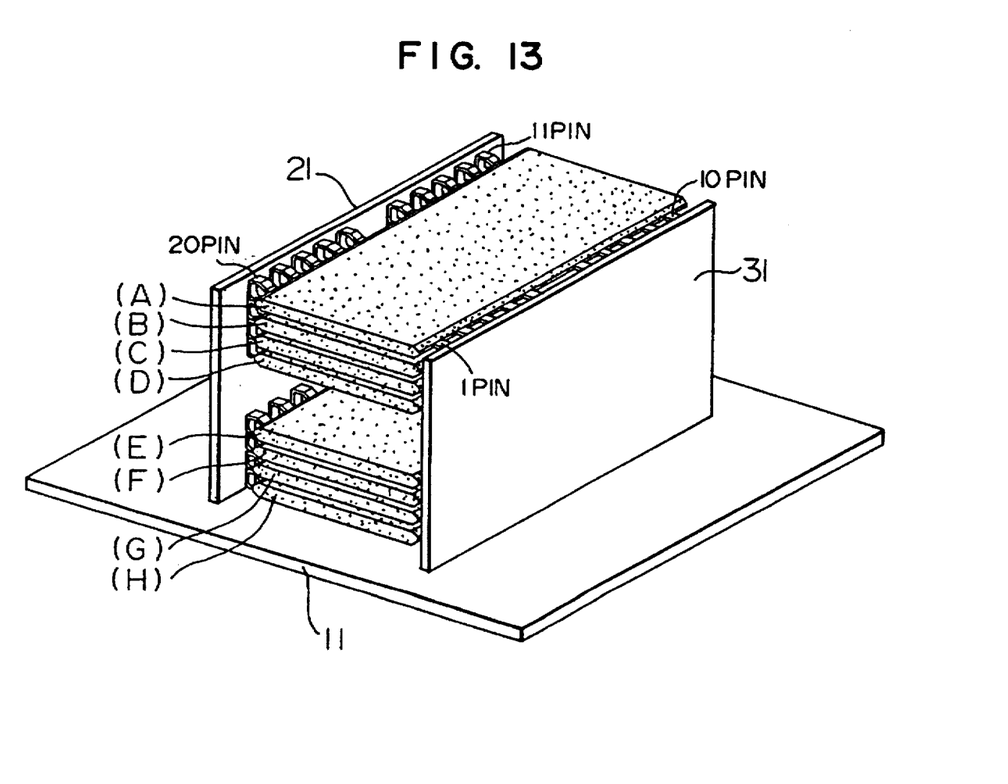
FIG. 13 is a perspective view showing another embodiment of a module structure using the semiconductor devices of the present invention.

FIG. 13 shows an embodiment of a module structure in which semiconductor devices stacked in a plurality of, for example, four layers are put vertically in a plurality of, for example, two columns. The outer leads of the semiconductor devices (A) to (D) and (E) to (H) constituting the two stacked devices are soldered to substrates 21 and 31. Preferably, all of the outer leads of the semiconductor devices (A) to (D) and (E) to (H) are the normally bent or reversely bent outer leads. In this case, if the pins 1 to 10 of the outer leads of the semiconductor devices (A) to (E) are soldered to the same board as that to which the pins 1 to 10 of the outer leads of the semiconductor devices (E) to (H) are soldered, for example, the board 31, a wiring length of connecting the pin 1 of the semiconductor devices (A) to (D) to the pin 1 of the semiconductor devices (E) to (H), for example, can be shortened. Accordingly, noise can be reduced and high-speed data processing can be attained in the same manner as the embodiment of FIG. 12. Furthermore, the semiconductor devices can be mounted with high density and accordingly a memory capacity in the same space as in the prior art can be increased.

A method of fabricating such a module structure is now described. Description is made to the case where the outer leads of the semiconductor devices are normal as shown in FIGS. 8 and 9.

As one method, in the same manner as the fabricating method of the stacked device of FIG. 9, the semiconductor devices (A) to (D) in one column to be stacked are soldered to each other and the semiconductor devices (E) to (H) in the other column to be stacked are then soldered to each other in the same manner. The two stacked devices are soldered to the boards 21 and 31. In the soldering to the boards 21 and 31, soldering paste is applied to the surface P of the outer leads shown in FIG. 8 to solder.

On the other hand, when the outer leads of the semiconductor devices are provided with the solder-plated layers 12A and 12B as shown in FIG. 10, all of the semiconductor devices (A) to (H) are disposed as shown in FIG. 13 and are then soldered collectively in the same manner as the embodiment of FIG. 11.

While the present invention has been described with reference to the embodiments in which the present invention is applied to a thin type semiconductor device of the TOC package, the present invention may also be applied to a thin type semiconductor device of a type in which a semiconductor chip and inner leads are connected directly through adhesives without providing the insulating film tape.

The invention made by the inventor has been described in detail with reference to the embodiments. While the invention is not limited thereto, it is a matter of course that various modification can be made without departing from its gist.

We claim:

1. A semiconductor device comprising:
   a semiconductor chip having a main surface, a rear surface opposite to said main surface, and a side surface extending from said main surface to said rear surface, said main surface having semiconductor elements and external terminals;
   a plurality of leads each having an inner lead an outer lead, said inner leads and of said plurality of leads being disposed adjacent to said side surface of said semiconductor chip;
   bonding wires electrically connecting said external terminals with said inner leads;
   means for supporting said semiconductor chip, said means having a first portion disposed on said main surface of said semiconductor chip and a second portion outside of said semiconductor chip, said first portion of said means having an upper surface and a lower surface opposite to said upper surface, said lower surface being affixed to said main surface of said semiconductor chip by an adhesive; and
   a resin molding sealing said semiconductor chip, said inner leads of said plurality of leads, bonding wires and said means,
   wherein said inner leads of said plurality of leads are disposed between said main surface and said rear surface of said semiconductor chip in a thickness direction of said semiconductor chip, and
   wherein a height from said main surface of said semiconductor chip to said upper surface of said means is smaller than a height from said main surface of said semiconductor chip to an apex of each of said bonding wires.

2. A semiconductor device according to claim 1, wherein said means includes a chip supporting lead.

3. A semiconductor device according to claim 2, wherein one end of said chip supporting lead terminates at a boundary between an inside and an outside of said resin molding.

4. A semiconductor device according to claim 3, wherein said chip supporting lead has a stepped portion between said side surface of said semiconductor chip and said boundary of said resin molding.

5. A semiconductor device according to claim 4, wherein said one end of said chip supporting lead is positioned at a substantially same level as said plurality of leads in said thickness direction of said semiconductor chip.

6. A semiconductor device according to claim 1, wherein said rear surface of said semiconductor chip contacts said resin molding.

7. A semiconductor device comprising:
   a rectangular-shaped semiconductor chip having a main surface, a rear surface opposite to said main surface, and a side surface extending from said main surface to said rear surface, said main surface having semiconductor elements and external terminals, said rectangular-shaped semiconductor chip having a pair of longer edges and a pair of shorter edges;
   a plurality of leads arranged along said pair of longer edges, each having an inner lead and an outer lead, said inner leads of said plurality of leads being disposed adjacent to said side surface of said rectangular-shaped semiconductor chip;
   bonding wires electrically connecting said external terminals with said inner leads;
   a first means and a second means for supporting said rectangular-shaped semiconductor chip, said first means extending from an outside of said rectangular-shaped semiconductor chip to said main surface of rectangular-shaped semiconductor chip across one of said pair of shorter edges, said second means extending from said outside of said rectangular-shaped semiconductor chip to said main surface of rectangular-shaped semiconductor chip across the other of said pair of shorter edges, each of said first and second means having a first portion disposed on said main surface of said rectangular-shaped semiconductor chip and a second portion outside of said rectangular-shaped semiconductor chip, each of said first portions of said first and second means having an upper surface and a lower surface opposite to said upper surface, each of said lower surfaces of said first and second means being affixed to said main surface of said rectangular-shaped semiconductor chip by an adhesive; and
   a rectangular-shaped resin molding sealing said rectangular-shaped semiconductor chip, said inner leads of said plurality of leads, bonding wires and said first and second means, said rectangular-shaped resin molding having a pair of longer side surfaces along said pair of longer edges of said rectangular-shaped semiconductor chip and a pair of shorter side surfaces along said pair of shorter edges of said rectangular-shaped semiconductor chip, said outer leads of said plurality of leads protruding outwardly from said pair of longer side surfaces of said rectangular-shaped resin molding;
   wherein said inner leads of said plurality of leads are disposed between said main surface and said rear surface of said rectangular-shaped semiconductor chip in a thickness direction of said rectangular-shaped semiconductor chip,
   wherein a height from said main surface of said rectangular-shaped semiconductor chip to said upper surface of each of said first and second means is smaller than a height from said main surface of said rectangular-shaped semiconductor chip to an apex of each of said bonding wires.

8. A semiconductor device according to claim 7, wherein said first means includes a first chip supporting lead, and wherein said second means includes a second chip supporting lead.

9. A semiconductor device according to claim 8, wherein one end of said first chip supporting lead terminates at one of said pair of shorter side surfaces of said resin molding, and wherein one end of said second chip supporting lead terminates at the other of said pair of shorter side surfaces of said resin molding.

10. A semiconductor device according to claim 9, wherein said first chip supporting lead has a stepped portion between said one of said pair of shorter side surfaces of said resin molding and said side surface of said rectangular-shaped semiconductor chip, and wherein said second chip supporting lead has a stepped portion between the other of said pair of shorter side surfaces of said resin molding and said side surface of said rectangular-shaped semiconductor chip.

11. A semiconductor device according to claim 10, wherein each of said one ends of said first and second chip supporting leads is positioned at a substantially same level as said plurality of leads in said thickness direction of said rectangular-shaped semiconductor chip.

12. A semiconductor device according to claim 7, wherein said rear surface of said rectangular-shaped semiconductor chip contacts said resin molding.

13. A semiconductor device comprising:
   a semiconductor chip having a main surface, a rear surface opposite to said main surface, and a side surface extending from said main surface to said rear surface, said main surface having semiconductor elements and external terminals;

a plurality of leads, each having an inner lead and an outer lead, said inner leads of said plurality of leads being disposed adjacent to said side surface of said semiconductor chip, each of said inner leads having an upper surface and a lower surface opposite to said upper surface;

bonding wires electrically connecting said external terminals with said inner leads, said bonding wires being contacted with said upper surfaces of said inner leads respectively;

means for supporting said semiconductor chip, said means having a first portion disposed on said main surface of said semiconductor chip and a second portion outside of said semiconductor chip, said first portion of said means having an upper surface and a lower surface opposite to said upper surface, said lower surface of said means being affixed to said main surface of said semiconductor chip by an adhesive; and a resin molding sealing said semiconductor chip, said inner leads of said plurality of leads, bonding wires and said means, wherein said upper surfaces of said inner leads of said plurality of leads are disposed under said main surface of said semiconductor chip in a thickness direction of said semiconductor chip, wherein a height from said main surface of said semiconductor chip to said upper surface of said means is smaller than a height from said main surface of said semiconductor chip to an apex of each of said bonding wires.

14. A semiconductor device according to claim 13, wherein said means includes a chip supporting lead.

15. A semiconductor device according to claim 14, wherein one end of said chip supporting lead terminates at a boundary between an inside and an outside of said resin molding.

16. A semiconductor device according to claim 15, wherein said chip supporting lead has a stepped portion between said side surface of said semiconductor chip and said boundary of said resin molding.

17. A semiconductor device according to claim 16, wherein said one end of said chip supporting lead is positioned at a substantially same level as said plurality of leads in said thickness direction of said semiconductor chip.

18. A semiconductor device according to claim 13, wherein said rear surface of said semiconductor chip contacts said resin molding.

19. A semiconductor device comprising:

a semiconductor chip having a main surface, a rear surface opposite to said main surface, and a side surface extending from said main surface to said rear surface, said main surface having semiconductor elements and external terminals;

a plurality of leads, each having an inner lead and an outer lead, said inner leads of said plurality of leads being disposed adjacent to said side surface of said semiconductor chip;

bonding wires electrically connecting said external terminals with said inner leads;

a member being disposed on said main surface of said semiconductor chip and extending from said main surface to the outside of said semiconductor chip, said member having an upper surface and a lower surface opposite to said upper surface, said lower surface being affixed to said main surface of said semiconductor chip by an adhesive; and a resin molding sealing said semiconductor chip, said inner leads of said plurality of leads, bonding wires and said member, wherein said inner leads of said plurality of leads are disposed under said main surface of said semiconductor chip in a thickness direction of said semiconductor chip, and wherein a height from said main surface of said semiconductor chip to said upper surface of said member is smaller than a height from said main surface of said semiconductor chip to an apex of each of said bonding wires.

20. A semiconductor device according to claim 19, wherein said member includes a chip supporting lead.

21. A semiconductor device according to claim 20, wherein one end of said chip supporting lead terminates at a boundary between an inside and an outside of said resin molding.

22. A semiconductor device according to claim 21, wherein said chip supporting lead has a stepped portion between said side surface of said semiconductor chip and said boundary of said resin molding.

23. A semiconductor device according to claim 22, wherein said one end of said chip supporting lead is positioned at a substantially same level as said plurality of leads in said thickness direction of said semiconductor chip.

24. A semiconductor device according to claim 19, wherein said rear surface of said semiconductor chip contacts with said resin molding.

25. A semiconductor device comprising:

a semiconductor chip having a main surface, a rear surface opposite to said main surface, and a side surface extending from said main surface to said rear surface, said main surface having semiconductor elements and external terminals;

a plurality of leads each having an inner lead and an outer lead which is continuous with said inner lead, said inner leads of said plurality of leads being disposed adjacent to said side surface of said semiconductor chip and being spaced from said surface in a plane view;

bonding wires electrically connecting said external terminals with said inner leads;

means for supporting said semiconductor chip, said means having a first portion disposed on said main surface of said semiconductor chip and a second portion outside of said semiconductor chip, said first portion of said means having an upper surface and a lower surface opposite to said upper surface, said lower surface being affixed to said main surface of said semiconductor chip by an adhesive; and a resin molding sealing said semiconductor chip, said inner leads of said plurality of leads, bonding wires and said means, said resin molding having an upper surface, a lower surface opposite to said upper surface and a side surface extending from said upper surface to said lower surface, each of said outer leads protruding outwardly from said side surface of said resin molding and having a first portion and a second portion which are spaced from each other in a thickness direction of said semiconductor chip, wherein said first and second portions of said outer leads overlap each other in a plane view, wherein said inner leads of said plurality of leads are disposed between said main surface and said rear surface of said semiconductor chip in said thickness direction of said semiconductor chip, wherein a height from said main surface of said semiconductor chip to said upper surface of said means is smaller than a height from said main surface of said semiconductor chip to an apex of each of said bonding wires.

26. A semiconductor device according to claim 25, wherein said means includes a chip supporting lead.

27. A semiconductor device according to claim 26, wherein one end of said chip supporting lead terminates at a boundary between an inside and an outside of said resin molding.

28. A semiconductor device according to claim 27, wherein said chip supporting lead has a stepped portion between said side surface of said semiconductor chip and said boundary of said resin molding.

29. A semiconductor device according to claim 28, wherein said one end of said chip supporting lead is positioned at the substantially same level as said plurality of leads in said thickness direction of said semiconductor chip.

30. A semiconductor device according to claim 25, wherein said rear surface of said semiconductor chip contacts with said resin molding.

31. A semiconductor device according to claim 25, wherein a distance between said first portion and said second portion of said outer lead is wider than a distance between said upper surface and lower surface of said resin molding in said thickness direction of said semiconductor chip.

32. A semiconductor device according to claim 25, wherein said semiconductor chip includes a memory device.

33. A semiconductor device according to claim 25, wherein said external terminals are arranged at the periphery of said semiconductor chip.

34. A semiconductor device according to claim 25, wherein said semiconductor device is a thin small outline package.

35. A semiconductor device according to claim 25, wherein said first portion of each of said outer leads extends in a direction substantially parallel with said upper surface of said resin molding, and wherein said second portion of each of said outer leads extends in a direction substantially parallel with said lower surface of said resin molding.

36. A semiconductor device according to claim 35, wherein said second portion of each of said outer leads is disposed at the lower level than said lower surface of said resin molding in said thickness direction of said semiconductor chip.

* * * * *